United States Patent [19]

Oldham

[11] Patent Number: 5,602,787
[45] Date of Patent: Feb. 11, 1997

[54] DATA MEMORY WITH SENSE AMPLIFIER AND METHOD OF OPERATION

[75] Inventor: Harry E. Oldham, Swavesey, United Kingdom

[73] Assignee: Advanced Risc Machines Limited, Cambridge, United Kingdom

[21] Appl. No.: 379,013

[22] Filed: Jan. 27, 1995

[30] Foreign Application Priority Data

Jan. 31, 1994 [GB] United Kingdom .................. 9401802

[51] Int. Cl.$^6$ ...................................................... G11C 7/00
[52] U.S. Cl. ...................... 365/205; 365/194; 365/230.06
[58] Field of Search .................................... 365/205, 207, 365/203, 149, 230.06, 194, 49

[56] References Cited

U.S. PATENT DOCUMENTS

| | | | |
|---|---|---|---|
| 4,050,061 | 9/1977 | Kitagawa | 340/173 R |
| 5,079,449 | 1/1992 | Obata | 307/465 |
| 5,293,343 | 3/1994 | Raab et al. | 365/205 |
| 5,325,335 | 6/1994 | Ang et al. | 365/205 |
| 5,386,389 | 1/1995 | Taoka | 365/205 X |
| 5,416,742 | 5/1995 | Takada | 365/205 X |
| 5,416,743 | 5/1995 | Allan et al. | 365/205 X |

FOREIGN PATENT DOCUMENTS

0322902A2  7/1989  European Pat. Off. .......... G11C 7/00

Primary Examiner—David C. Nelms
Assistant Examiner—Huan Hoang
Attorney, Agent, or Firm—Albert C. Smith

[57] ABSTRACT

A data memory includes a plurality of memory cells that are selectively operable during a memory read operation to generate a data signal indicative of data stored in that memory cell, and one or more sense amplifiers are connected to receive data signals from a plurality of the memory cells. An address decoder is responsive to a memory address supplied to the data memory for controlling one of said plurality of memory cells connected to each of the sense amplifiers to generate a respective data signal under the control of a first control signal. The data memory also includes circuitry for delaying the first control signal to generate a second control signal, and for energizing the one or more sense amplifiers for operation in response to the second control signal.

10 Claims, 5 Drawing Sheets

DATA MEMORY WITH SENSE AMPLIFIER AND METHOD OF OPERATION

BACKGROUND OF THE INVENTION

1. Field of the Invention

This invention relates to data memories with sense amplifiers.

2. Description of the Prior Art

Many random access memories (RAMs) employ sense amplifiers to increase the speed of reading data stored in respective memory cells. In typical RAMs the memory cells are arranged in groups (or rows), with each sense amplifier being connected in parallel to a respective memory cell in each of the rows. A part of a memory address supplied to the RAM is used to select and activate one of the rows; the outputs of the memory cells in the activated row are connected via bit lines to the inputs of the sense amplifiers.

A RAM read or write cycle may be initiated either by placing a new address on an address input of the RAM (which is usually the case for individual RAM chips) of by a transition in a clock or other control signal (which is generally the case for a RAM in an embedded controller device). A number of events then take place. Firstly, a state of RAM pre-charge is disabled, releasing the RAM from an idle condition and priming it for an active read of write operation. At the same time, of very shortly after, a row decoder starts to decode the input address, in order to generate a unique row-line output. For a medium sized RAM this may involve decoding eight address inputs to select one of 256 row control lines. After the row control line has been selected, all of the memory cells which are controlled by that row control line are activated, and those particular memory cells can be read-from or written-to.

In the case of a read cycle, the selected memory cells begin to charge or discharge bit lines connecting the memory cells to the respective sense amplifiers, and subsequently the charge currents or resulting voltage changes on the bit lines are detected by the sense amplifiers. Each memory cell is physically small and so the drive strength is weak, yet the bit lines are shared by many memory cells. Inevitably, the rate of voltage of current change on the bit lines is slow, and so high-gain sense amplifiers are used for high-speed RAMs because they can react quickly to small changes in input. Finally the outputs of the sense amplifiers (i.e. the data output of that row of the RAM) are written to the system of output data bus via a powerful buffer.

Between the bit-lines and the sense amplifier there may also be a multiplexing stage (column decode) which further reduces the selection of RAM cells before presentation at the sense amplifier inputs, though this stage is often absent; column decoding is often enabled at the same time as row decoding.

Sense amplifiers are designed to be most responsive when their input or inputs are in the RAM-idle state. In this way the sense amplifiers are primed and ready to react quickly to any change in input current or voltage. The idle state of a memory cell often means that the sense amplifier's inputs are pre-charged to a logic-high level, or equalised to a mid-range level. While the sense amplifier inputs are in this primed mode, the sense amplifier consumes maximum current. The sense amplifier's current drain (and power consumption) will not begin to diminish until sensing takes place, and this needs a movement in the input current or voltage.

SUMMARY OF THE INVENTION

It is an object of the invention to reduce the power consumption of a data memory.

This invention provides a data memory comprising: a plurality of memory cells, each memory cell being selectively operable during a memory read operation to generate a data signal indicative of data stored in that memory cell; one or more sense amplifiers, each sense amplifier being connected to receive data signals from a plurality of the memory cells; an address decoder, responsive to a memory address supplied to the data memory, for controlling one of the plurality of memory cells connected to each sense amplifier to generate a respective data signal; and means for energising the one or more sense amplifiers for operation after the start of the decoding operation of the address decoder.

The invention recognises that modern RAM designs may spend up to 40% of the read access time in the row decode operation. Thus if (as in previous RAM designs) the sense amplifier is enabled at the same time that the row decoders being to work, then the sense amplifier will be held in its maximum current mode throughout the time that the row-lines are being decoded and driven. This in turn can give rise to a considerable and unnecessary power drain.

The invention addresses this problem by arranging for the one or more sense amplifiers to be energised for operation during a read cycle after the start of the decoding operation of the address decoder. Thus, the high current consumption of the sense amplifiers is avoided during at least part of the time taken for the decoding operation.

The sense amplifiers are enabled after the start of the decoding operation. Row decoders are relatively large and slow, in contrast to generally much smaller and quicker column decoders.

The skilled man will appreciate that the quiescent supply current of the sense amplifiers (i.e. the supply current when the sense amplifiers are not energised for operation) need not necessarily be zero, but is considerably lower than the operational current of the sense amplifiers.

Preferably the data memory is organised as a plurality of groups of memory cells, with a plurality of sense amplifiers, each sense amplifier being connected to receive a data signal from a respective memory cell in each of the groups of memory cells, and the address decoder is operable to control the memory cells in one of the groups of memory cells to generate respective data signals. In this way a separate address decoder stage for each memory cell is not required; instead, the address decoder selects a group of memory cells at a time.

In order to improve the power consumption of the data memory Further, it is preferred that the means for energising is operable to energise the one or more sense amplifiers for operation after completion of the decoding operation of the address decoder.

In one preferred embodiment the address decoder is operable to generate one of a plurality of selection signals to select a respective one of the memory cells connected to each sense amplifier; and the means for energising is operable to energise the one or more sense amplifiers for operation in response to the generation of a selection signal by the address decoder.

In another preferred embodiment, the address decoder is operable to generate substantially simultaneously:

(i) one of a plurality of selection signals to select a respective one of the memory cells connected to each sense amplifier; and (ii) a completion signal indicative of completion of the decoding operation of the address decoder;

and the means for energising is operable to energise the one or more sense amplifiers for operation in response to the generation of the completion signal by the address decoder.

In a further preferred embodiment the address decoder is operable under the control of a first control signal; the data memory comprises means for delaying the first control signal, to generate a second control signal; and the means for energising is operable to energise the one or more sense amplifiers for operation in response to the second control signal. Alternatively, the one or more sense amplifiers may be energised in response to a separately generated control signal.

It is preferred that the means for delaying comprises means for logically combining the first control signal with a system clock signal. In this way, the address decoding stage can be initiated by a current system clock cycle, with the sense amplifiers being energised for operation at a later phase of the system clock signal.

Preferably each memory cell is operable to generate two complementary data outputs. The skilled man will appreciate that the complementary output signals need not be complementary except during an access cycle in which the data bit stored in a memory cell is accessed. For example, before the memory cell is accessed, the output signals may both be in a pre-charged (high) state, so that as the access operation takes place, one of the two output signals is pulled low. Alternatively, the output signals could both start from a low state, or the complementary nature of the output signals could indeed be maintained all of the time. However, in a preferred embodiment the data memory comprises means for pre-charging the two data outputs of each memory cell to a predetermined logical state (e.g. a high state).

The invention is particularly usefully employed in a cache memory. In this case, it is preferred that the cache memory comprises a tag memory operable to generate the first control signal if a required data item is stored in the data memory.

Viewed from a second aspect this invention provides a method of operation of a data memory, the data memory comprising a plurality of memory cells, each memory cell being selectively operable during a memory read operation to generate a data signal indicative of data stored in that memory cell; and one or more sense amplifiers, each sense amplifier being connected to receive data signals from a plurality of the memory cells, the method comprising the steps of: controlling one of the plurality of memory cells connected to each sense amplifier to generate a respective data signal, in response to a memory address supplied to the data memory; and after the start of the controlling step, energising the one or more sense amplifiers for operation.

BRIEF DESCRIPTION OF THE DRAWINGS

The above and other objects, features and advantages of the invention will be apparent from the following detailed description of illustrative embodiments which is to be read in connection with the accompanying drawings, in which.

DESCRIPTION OF THE PREFERRED EMBODIMENTS

Figure 1:
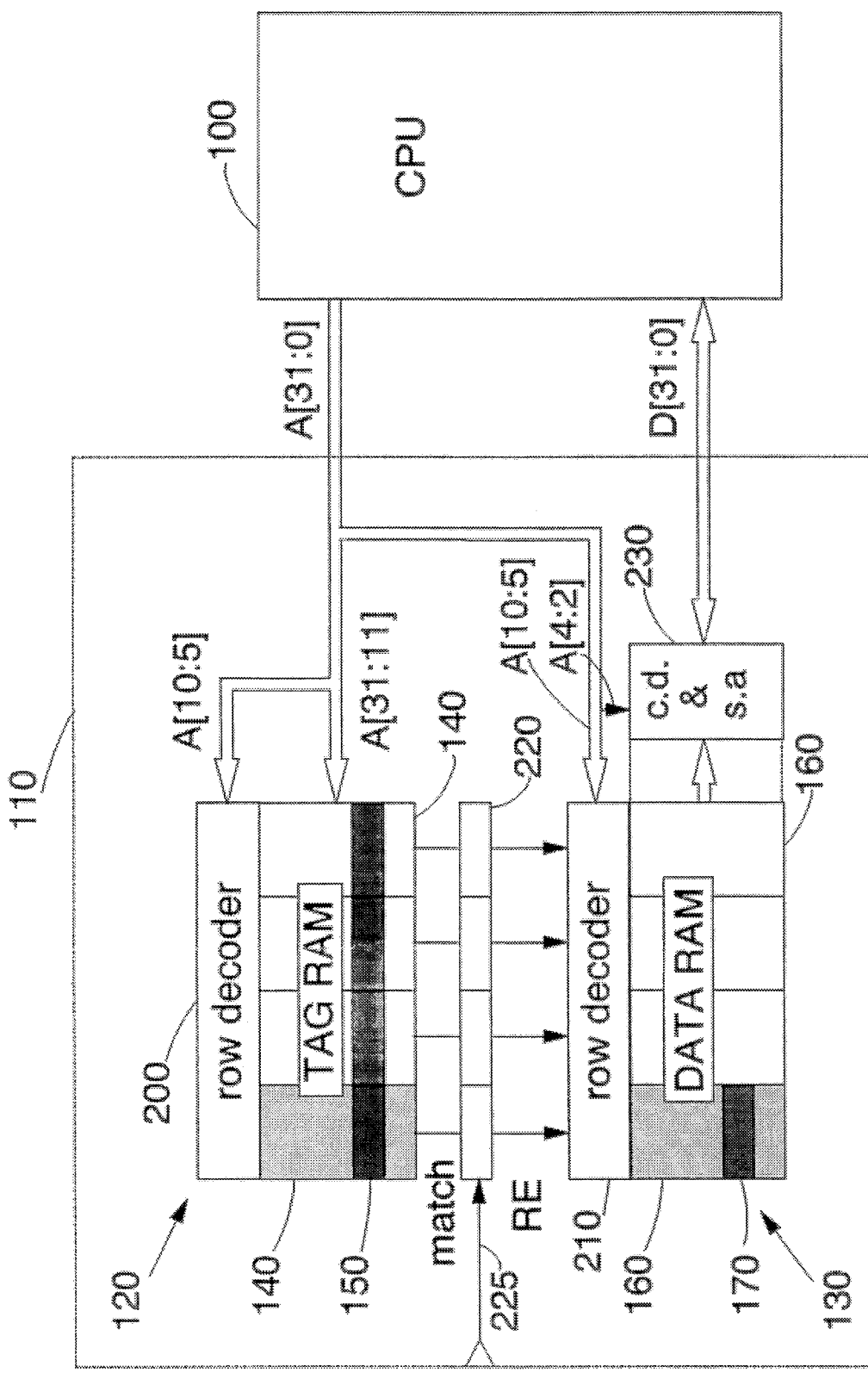
FIG. 1 is a schematic block diagram of a data processing apparatus.

Referring now to FIG. 1, a data processing apparatus comprises a central processing unit (CPU) 100 and a cache memory 110. The CPU 100 and the cache memory 110 may be fabricated as respective parts of a common integrated circuit.

The cache memory 110 comprises a tag RAM 120 and a data RAM 130. The tag RAM comprises four tag units 140, each of which comprises 64 tag lines 150. Similarly, the data RAM comprises four cache RAMs 160, each having 64 cache lines 170. Each cache line stores eight data words, each comprising 32 bits (four bytes) of data.

When the CPU 100 requires access to data having a particular address, it transmits a 32-bit address signal A[31:0] to the cache memory 110. Data are exchanged between the CPU 100 and the cache memory 110 on a data bus carrying using 32-bit data signals D[31:0].

Of the 32 bits of the address signal, the 5th to 10th bits, i.e. A[10:5] are supplied to a tag row decoder 200 forming part of the tag 120 and also to a data row decoder 210 forming part of the data RAM 130. These six address bits specify a particular one of the tag lines 150 and the cache lines 170. In FIG. 1 the selected tag line 150 and cache line 170 are indicated schematically by heavy shading.

The tag lines 150 store 21 bit addresses corresponding to the 11th to 31st bits of a data address. In order to detect whether data corresponding to a particular data address are stored in the data RAM 130, the 11th to 31st bits of the address generated by the CPU 100, i.e. A[31:11], are compared with the content of the currently selected tag line 150 in each of the four tag units 140.

For each tag unit 140, if the contents of the selected tag line in that tag unit 140 are equal to the 21 high order bits A[31:11] of the current address output by the CPU 100, a match signal is set for that tag unit.

As mentioned above, the 5th to 10th bits of the current address output by the CPU 100 are also supplied to the data row decoder 210 which selects a particular cache line 170 (indicated in FIG. 2 by heavy shading) in each of the cache RAMs 160. When a match signal is generated by one of the tag units 140, the match signal is gated by control logic 220 with a system clocking signal 225, to generate a respective read enable (RE) signal. The read enable signal is supplied to and selects one of the cache RAMs 160.

In other words, the combination of the selection of a cache RAM 160 by the read enable signal and the selection of a cache line 170 by the data row decoder 210 identifies a single cache line 170 in a single cache RAM 160.

The eight data words stored in the selected cache line are passed to column decoding and sense amplifier circuitry 230, which selects one of the eight 32-bit data words for access in dependence on the 2nd to 4th bits (i.e. A[4:2]) of the address signal output by the CPU 100. Data outputs corresponding to the 32 bits of the selected data word are processed by 32 sense amplifiers, to be described in more detail below. By employing a stage of multiplexing (column decoding) before the sense amplification, the number of sense amplifiers required in this embodiment is reduced from 8×32 (if column decoding were performed later) to 32.

Each output data word is a 32-bit data word containing four bytes of data. Generally the entire 32-bit word is accessed (e.g. during fetching of 32-bit instructions). However, if access to a particular byte is required, the byte to be addressed is indicated by the 0th and 1st bits A[1:0] of the data address.

The addressing function provided by the various portions of the address signal A[31:0] are summarised in the following table:

| Address bits | Function |
| --- | --- |
| A[31:11] | are compared with the contents of selected tag line in each tag unit |
| A[10:5] | are used to select a tag line in each tag unit and cache RAM |
| A[4:2] | control column decoder to select one of eight 32-bit data words |
| A[1:0] | select a single byte from a selected 32-bit data word |

Figure 2:
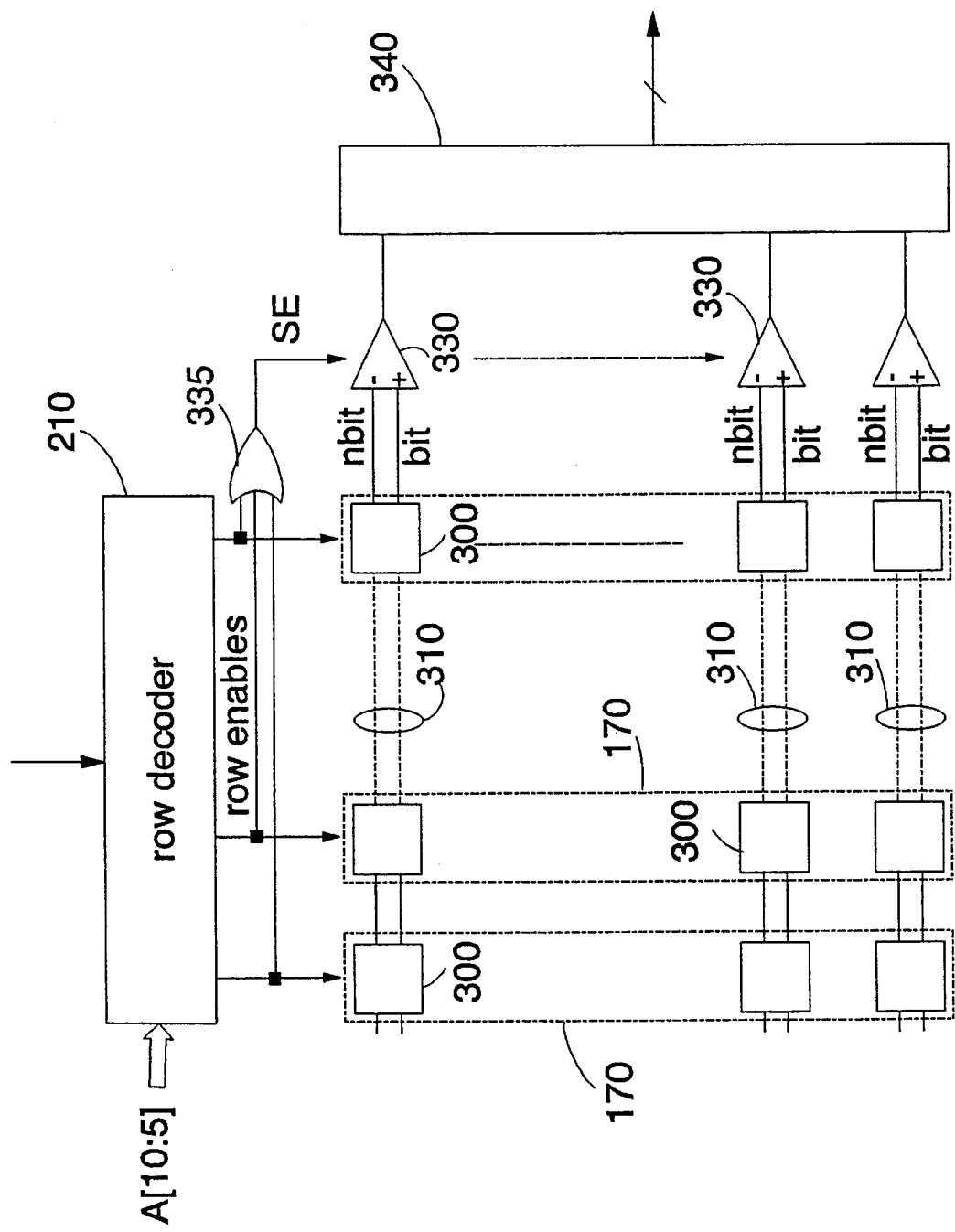
FIG. 2 is a schematic block diagram of one embodiment of a data RAM.

FIG. 2 is a schematic diagram of a cache RAM 160 comprising a plurality of memory cells 300 arranged to provide 64 cache lines 170, each being 256 bits wide.

Figure 4:
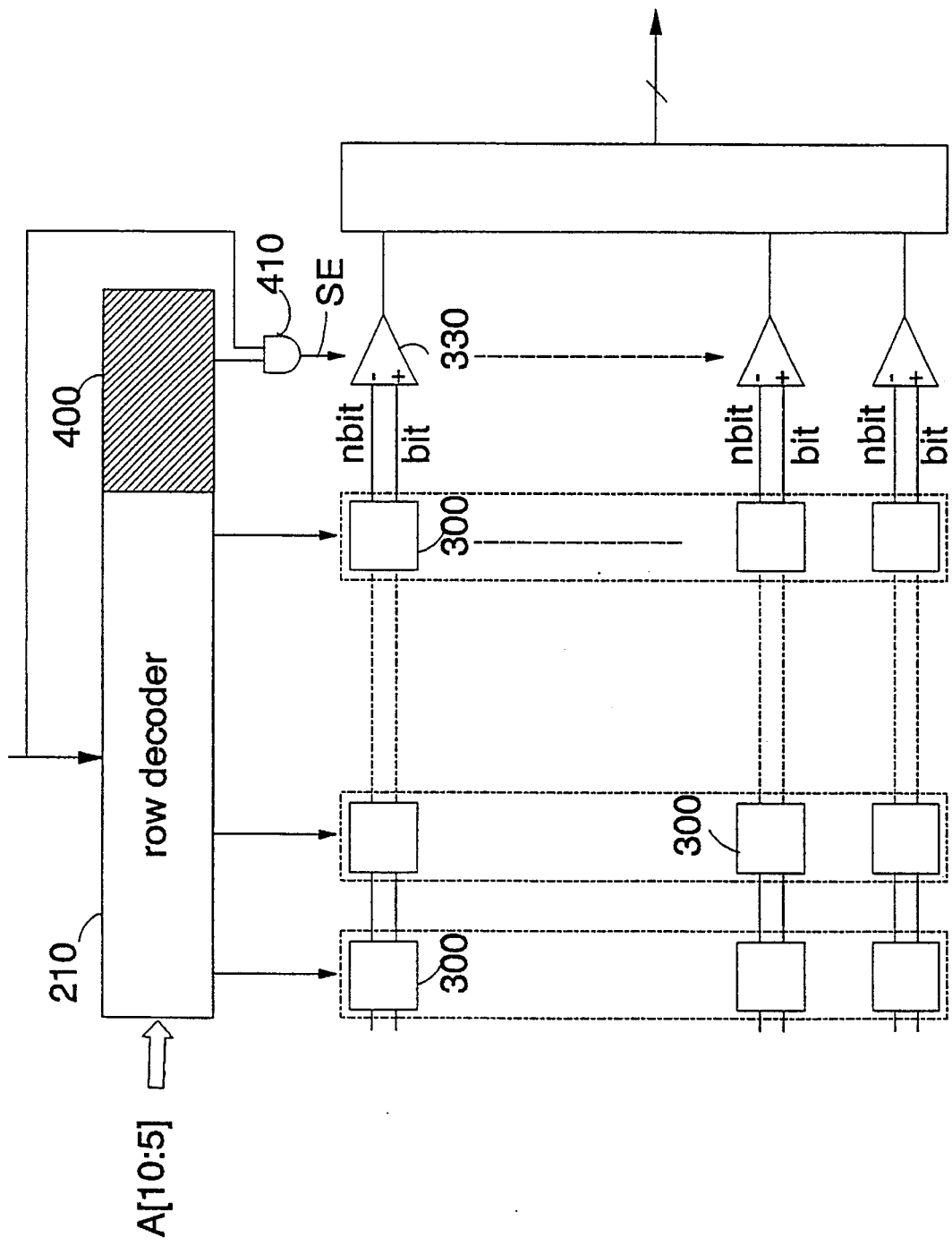
FIG. 4 is a schematic block diagram of a second embodiment of a data RAM.
Figure 5:
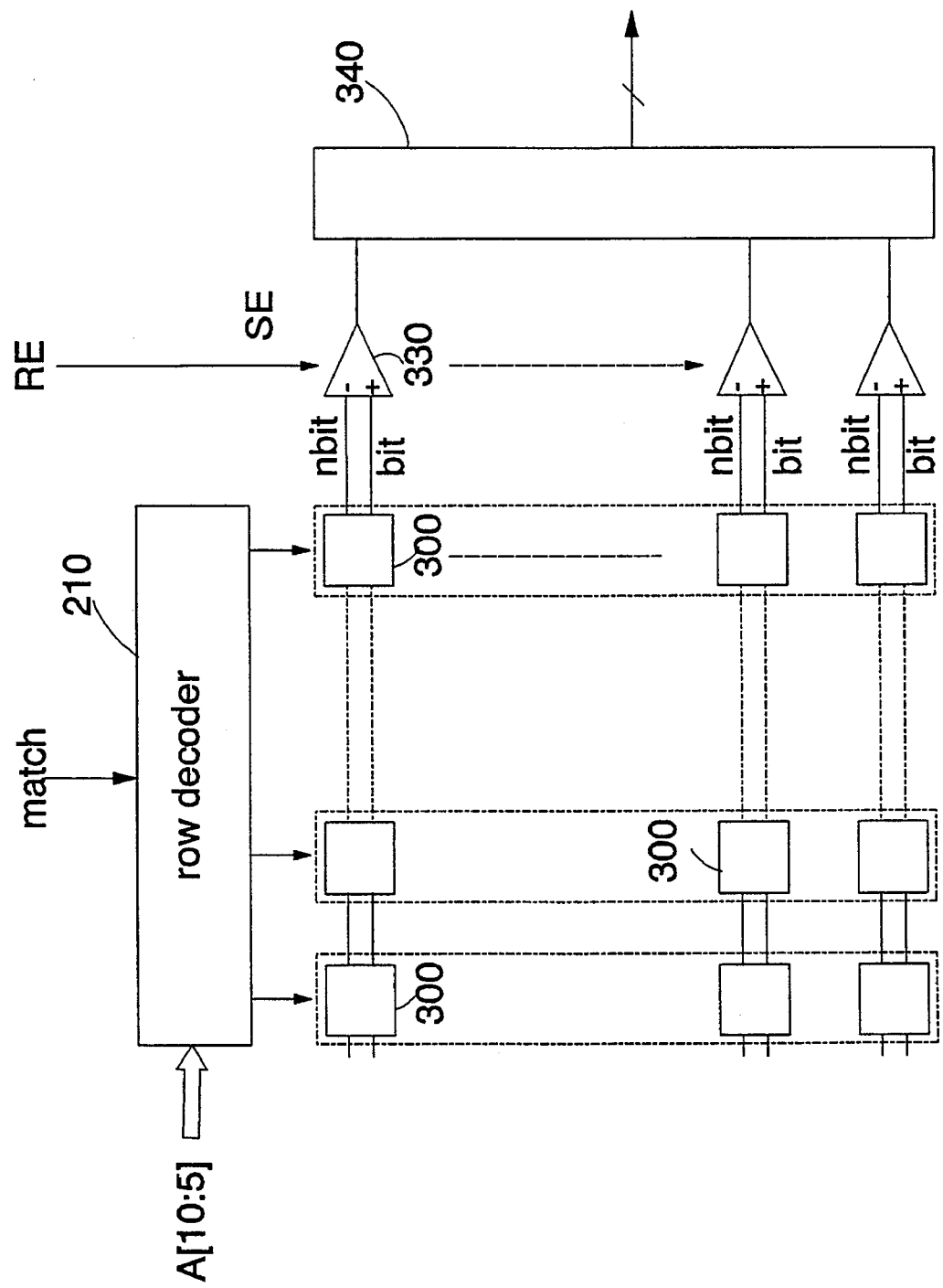
FIG. 5 is a schematic block diagram of a third embodiment of a data RAM.

In FIGS. 2, 4 and 5, the column decoding stage is omitted for clarity of the diagrams. It is assumed in each of these figures that the bit lines illustrated as connected to respective sense amplifiers are bit lines corresponding to the data word currently selected by the column decoder.

The data row decoder 210 receives the six-bit address signal A[10:5] used to select one of the 64 cache lines 170, and the read enable signal output by the control logic 220. The row decoder decodes the six-bit address signal to generate a single row enable signal to activate one of the cache lines 170. When a cache line 170 is activated, the memory cells in that cache line begin to charge or discharge respective bit lines 310.

Each memory cell 300 generates two complementary outputs on the bit lines 310, referred to as 'bit' and 'nbit'. Before a read operation is initiated, both of the 'bit' and 'nbit' outputs are held high, as part of a RAM pre-charging process. When a memory cell is read, if that memory cell is currently storing a logical 1 then its 'bit' output remains high and its 'nbit' output is driven low. Conversely, if that memory cell is currently storing a logical 0, then its 'bit' output is driven low and its 'nbit' output remains high.

It will therefore be clear that in this embodiment, the bitlines 'bit' and 'nbit' are complementary during access of that memory cell, even though they are both in the same logical state (high) between access operations. In other embodiments, the bitlines could be complementary all of the time.

The output of each of the memory cells 300 in the selected cache line is passed (via the column decoding stage—not shown) to a respective sense amplifier 330. The sense amplifiers are used to increase the speed of reading data from the memory cells 300, by sensing which of the sense amplifier inputs is being pulled low and quickly generating a binary output in response to that detection.

Accordingly, the sense amplifiers 330 are designed to be most responsive when their inputs are in the RAM-idle state. In this way the sense amplifiers are primed and ready to react quickly to any change in input current or voltage. In this embodiment, the idle state of a memory cell 300 means that the sense amplifier's inputs are pre-charged to a logic-high level. While the sense amplifier inputs are in this primed mode, the sense amplifier consumes maximum current. The sense amplifier's current drain (and power consumption) will not begin to diminish until sensing takes place, and this needs a movement in the input current or voltage.

In order to reduce the power drain of the sense amplifiers 330, the power supply to the sense amplifiers 330 is controlled by a sense enable (SE) signal which is generated by a logical OR gate 335 performing a logical OR operation on all of the row enable signals generated by the data row decoder 210. In this way, operation of the sense amplifiers 330 does not occur until one of the cache lines 170 has been selected and activated by the data row decoder 210. This means that the sense amplifiers are not operational during the period (approximately 40% of a read cycle) taken by the data row decoder 210 to decode the six-bit address signal A[10:5] and select one of the cache lines 170.

The data outputs of the sense amplifiers are either low or high, depending on whether the respective memory cell in the currently selected cache line 170 was storing a logical zero or a logical one. The sense amplifier outputs are then passed to a data buffer 340.

Figure 3:
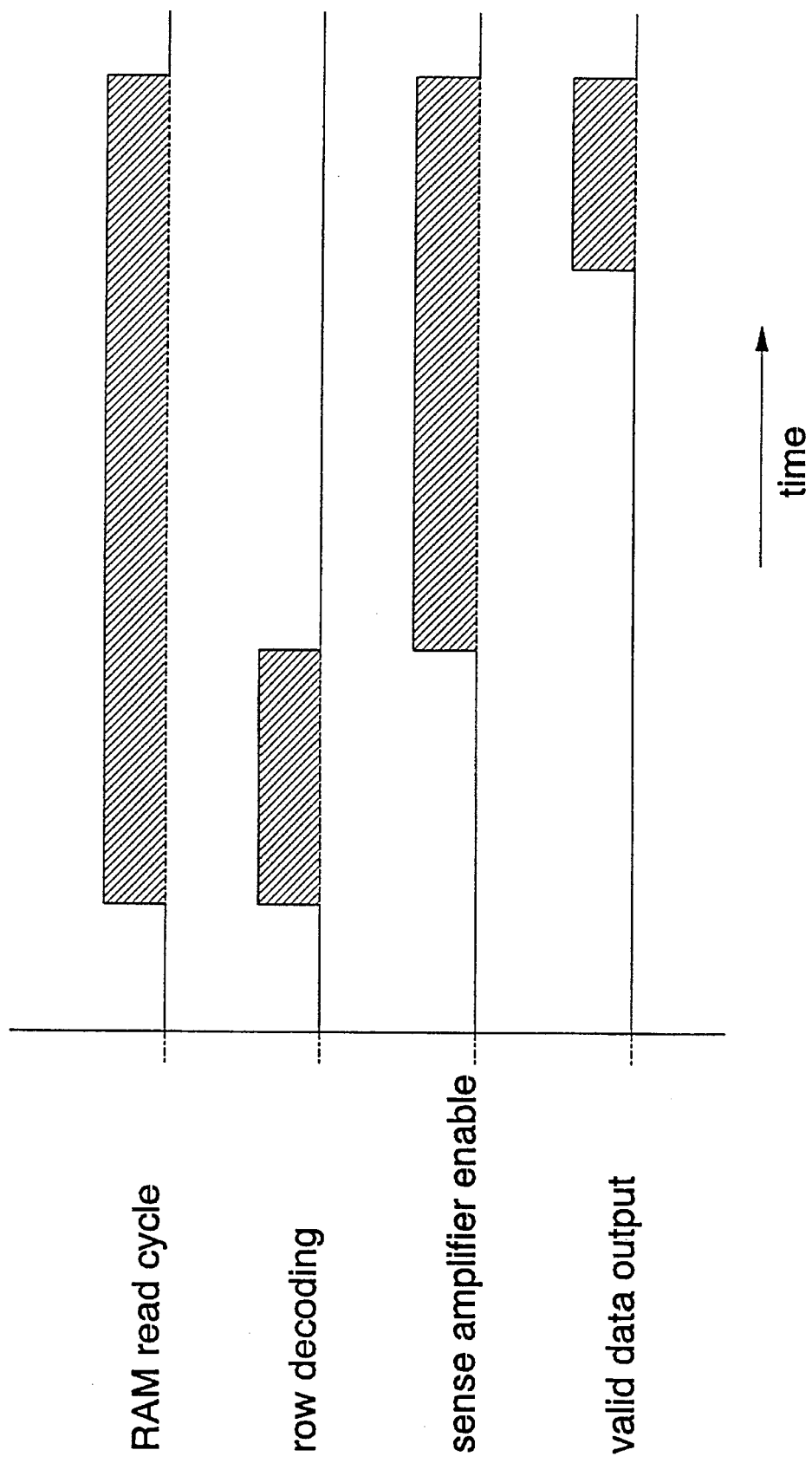
FIG. 3 is a timing diagram illustrating the operation of a data RAM.

FIG. 3 is a timing diagram illustrating the operation of the data RAM of FIG. 2. A RAM read cycle commences with a read enable signal being generated by the control logic 220. When the data row decoder 210 receives the read enable signal it initiates the row decoding process in which a single cache line 170 is selected in accordance with the state of the 6-bit address signal A[10:5]. The row decoding phase lasts for up to 40% of the read cycle.

When the row decoding phase is complete, a row enable signal is output by the data row decoder 210. This activates one of the cache lines 170 and also, via the logical OR gate 335, activates the sense amplifiers 330. The period during which the sense amplifiers 330 are enabled is illustrated in the third row of FIG. 3.

The memory cells 300 in the selected cache line 170 begin to change their outputs such that one of the two bit lines 310 connected to each memory cell 300 is pulled low. This change is detected by the sense amplifiers 330 which generate a corresponding valid data output towards the end of the RAM read cycle.

FIG. 4 is a schematic block diagram illustrating a second embodiment of a data RAM, in which the data row decoder 210 incorporates a 'dummy' decoding element 400. The dummy decoding element 400 employs the same circuitry as the remainder of the row decoder 210, and its output has the same output capacitance as the other row enable signals. However, the dummy decoding element 400 is arranged to be enabled irrespective of the address inputs to the row decoder 210. This means that the dummy decoding element 400 generates an output at substantially the same time as a cache line 170 is selected, whatever address is present on the address input A[10:5]. This output of the dummy decoding element 400 is gated, by an AND gate 410, with the read enable signal generated by the control logic 220, to form the sense enable signal for controlling the time of switching-on of the sense amplifiers 330.

The timing of the circuit illustrated in FIG. 4 is very similar to that described in FIG. 3, in that the sense amplifiers 330 are turned on at the end of the row decoding phase.

FIG. 5 is a schematic diagram of a further embodiment of a data RAM. In this embodiment, a conventional row decoder 210 is employed, but is arranged to respond to the match signal generated by the tag RAM 120 rather than the read enable signal generated by the control logic 220. The read enable signal generated by the control logic 220 instead forms the sense enable signal which controls operation of the sense amplifiers 330.

The circuit shown in FIG. 5 makes use of the delay between generation of the match output by the tag RAM and generation of the read enable signal corresponding to that match output by the control logic 220. The reason for the delay is that the control logic 220 gates the match output with other control signals such as the master clock 225 before generating the read enable signal. Typically, the match output precedes the read enable signal by three or four gate delays. Since this delay is similar to the time taken by the data row decoder 210 to decode the input address, it means that, on average, the sense amplifiers will be turned on at approximately the end of the row decoding phase. However, in the embodiment shown in FIG. 5, the two processes are not tied together in the same way as the corresponding processes in FIGS. 2 and 4. Accordingly, the precise time at which the sense amplifiers 330 are switched on in the embodiment of FIG. 5 will depend on the relative timing of the match output and the system clock signal 225.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A data memory comprising:

a plurality of memory cells, each said memory cell being selectively operable during a memory read operation to generate a data signal indicative of data stored in that memory cell;

one or more sense amplifiers, each said sense amplifier being connected to receive data signals from a plurality of said memory cells;

an address decoder, responsive to a memory address supplied to said data memory, for controlling one of said plurality of memory cells connected to each said sense amplifier to generate a respective data signal said address decoder being operable under the control of a first control signal;

said data memory also comprising means for delaying said first control signal, to generate a second control signal; and means for energising said one or more sense amplifiers for operation in response to said second control signal.

2. A data memory according to claim 1, further comprising:

a plurality of groups of memory cells; and a plurality of said sense amplifiers, each said sense amplifier being connected to receive a data signal from a respective memory cell in each of said groups of memory cells;

said address decoder being operable to control said memory cells in one of said groups of memory cells to generate respective data signals.

3. A data memory according to claim 1, in which:

said address decoder is operable to generate one of a plurality of selection signals to select a respective one of said memory cells connected to each sense amplifier; and said means for energising is operable to energise said one or more sense amplifiers for operation in response to the generation of a selection signal by said address decoder.

4. The data memory of claim 1, wherein said address decoder is operable to generate substantially simultaneously:

(i) one of a plurality of selection signals to select a respective one of said memory cells connected to each sense amplifier; and (ii) a completion signal indicative of completion of a decoding operation of said address decoder.

5. A data memory according to claim 1, in which each memory cell is operable to generate two complementary data outputs.

6. A data memory according to claim 5, comprising means for pre-charging said two data outputs of each memory cell to a predetermined logical state.

7. A data memory according to claim 1, in which said means for delaying comprises means for logically combining said first control signal with a system clock signal.

8. A cache memory comprising a data memory according to claim 7.

9. A cache memory according to claim 8, comprising a tag memory operable to generate said first control signal if a required data item is stored in said data memory.

10. A method of operation of a data memory, said data memory comprising a plurality of memory cells, each memory cell being selectively operable during a memory read operation to generate a data signal indicative of data stored in that memory cell; and one or more sense amplifiers, each sense amplifier being connected to receive data signals from a plurality of said memory cells, said method comprising the steps of:

controlling one of said plurality of memory cells connected to each sense amplifier to generate a first data signal, in response to a memory address supplied to said data memory;

delaying said first control signal, to generate a second control signal; and energising said one or more sense amplifiers for operation in response to said second control signal.

* * * * *